(12) United States Patent
David

(10) Patent No.: US 7,848,033 B2
(45) Date of Patent: Dec. 7, 2010

(54) OPTICAL CONCENTRATOR

(75) Inventor: Ofer David, Haifa (IL)

(73) Assignee: Elbit Systems Ltd., Haifa (IL)

( * ) Notice: Subject to any disclaimer, the term of this patent is extended or adjusted under 35 U.S.C. 154(b) by 465 days.

(21) Appl. No.: 11/667,639

(22) PCT Filed: Nov. 10, 2005

(86) PCT No.: PCT/IL2005/001182

§ 371 (c)(1),
(2), (4) Date: May 11, 2007

(87) PCT Pub. No.: WO2006/051536

PCT Pub. Date: May 18, 2006

(65) Prior Publication Data

US 2007/0268597 A1     Nov. 22, 2007

(30) Foreign Application Priority Data

Nov. 11, 2004 (IL) ..................... 165168

(51) Int. Cl.
*G02B 9/08* (2006.01)
(52) U.S. Cl. ..................... 359/742; 359/741
(58) Field of Classification Search ............ 359/742, 359/743, 741
See application file for complete search history.

(56) References Cited

U.S. PATENT DOCUMENTS

| | | | |
|---|---|---|---|
| 3,761,184 A * | 9/1973 | McLaughlin, Jr. | .......... 356/416 |
| 4,182,956 A | 1/1980 | Funk, Jr. et al. | |
| 4,341,471 A * | 7/1982 | Hogg et al. | .......... 356/343 |
| 4,675,531 A | 6/1987 | Clark et al. | |
| 4,689,652 A * | 8/1987 | Shimada et al. | .......... 257/443 |
| 7,221,524 B2 * | 5/2007 | Ye et al. | .......... 359/819 |
| 7,315,382 B2 * | 1/2008 | De Groot | .......... 356/503 |

FOREIGN PATENT DOCUMENTS

JP     58119081 A     7/1983

OTHER PUBLICATIONS

Quantum properties of light; Sep. 29, 2009.*
International Search Report for PCT/IL2005/001182 (2 pages).

(Continued)

*Primary Examiner*—Timothy J Thompson
(74) *Attorney, Agent, or Firm*—Steven M. Jensen; Edwards Angell Palmer & Dodge LLP

(57) ABSTRACT

Apparatus for concentrating light rays arriving from at least one opening onto a receiver, individual beams of the light rays each arriving at the apparatus substantially collimated, the apparatus including a respective Fresnel lens assembly for each opening, the Fresnel lens assembly including a first Fresnel lens, and a second Fresnel lens, the first Fresnel lens being located between the opening and the receiver, the second Fresnel lens being located between the first Fresnel lens and the receiver, the first Fresnel lens collimating the light rays arriving from the opening, the second Fresnel lens converging the collimated light rays onto the receiver, the opening being located in front of the Fresnel lens assembly, on the focal plane of the first Fresnel lens, centered on the focal point of the first Fresnel lens, and the receiver being located behind the Fresnel lens assembly, on the focal point of the second Fresnel lens.

16 Claims, 3 Drawing Sheets

OTHER PUBLICATIONS

Written Opinion of the International Searching Authority for PCT/IL2005/001182 (6 pages).

English Language Abstract of Japanese Patent No. 58119081 A (1 page), 1983.

* cited by examiner

OPTICAL CONCENTRATOR

CROSS-REFERENCE TO RELATED APPLICATIONS

This is a national stage filing which is based on and claims priority to and the benefit of International Application Number PCT/IL2005/001182 which itself is based on and claims priority to and the benefit of IL patent application Ser. No. 165,168. International Application Number PCT/IL2005/001182 was filed on Nov. 10, 2005, and it was published as International Publication Number WO 2006/051536 Al on May 18, 2006. IL patent application Ser. No. 165,168 was filed on Nov. 11, 2004. The entirety of each of these applications is incorporated herein by reference.

FIELD OF THE DISCLOSED TECHNIQUE

The disclosed technique relates to optics in general, and to methods and systems for concentrating light, in particular.

BACKGROUND OF THE DISCLOSED TECHNIQUE

The need to concentrate light is relevant in many technological applications. One such application is concentrating incoming light rays from a light source onto a photodetector. Such a photodetector may be detecting the wavelength of incoming light rays, its intensity, or various other properties or signals carried by incoming light rays. Photodetectors come in various sizes with regards to the size of their active detecting surface. Their price increases significantly with an increase in their active detecting surface. A photodetector, with an active detector surface in the square centimeter range, can cost many times the amount of a similar photodetector, with an active detector surface in the square millimeter range. It is therefore cost effective to be able to concentrate incoming light onto ever smaller photodetectors. Currently, optical systems exist which can achieve the goal of concentrating incoming light rays onto small photodetectors. The optical systems currently used to concentrate incoming light rays are usually either large, bulky or not cost effective. As such, they are not well suited to be used in cases where light concentration onto small detectors is required and the physical size of such optical systems needs to be small.

U.S. Pat. No. 5,604,607 issued to Mirzaoff, and entitled "Light concentrator system" is directed to a system for collecting and concentrating electromagnetic radiation. The system includes a photosensitive medium for capturing light and a planar array located proximate to the photosensitive medium for guiding the light into the photosensitive medium. The planar array includes a plurality of concentrator elements. The concentrator elements each have a circular input and a circular output opening, and a hyperbolic cross section. Between each input and output opening is a reflective inner wall. The reflective inner wall functions to guide and concentrate radiant energy or light impinging upon an input opening through the concentrator element to an output opening towards the photosensitive medium.

U.S. Pat. No. 6,541,694 issued to Winston et al., and entitled "Nonimaging light concentrator with uniform irradiance" is directed to a nonimaging light concentrator system and nonimaging optical mixer designs that produce uniform flux for use with photovoltaic dish concentrators. The system includes a primary collector of light, such as a reflector dish, for producing highly concentrated light flux. The system further includes an optical mixer located near the focal zone of the primary collector of light. The optical mixer includes a transparent entrance aperture and a transparent exit aperture. The optical mixer further includes an internally reflective housing for substantially total internal reflection of light. An array of photovoltaic cells is located near the transparent exit aperture.

The system works as follows. Light entering the system is collected by the primary collector of light and directed towards its focal zone. At the focal zone, the light enters an optical mixer. Light inside the optical mixer is provided to the array of photovoltaic cells by substantial total internal reflection inside the optical mixer. Substantial total internal reflection provides for uniform light flux on the array of photovoltaic cells.

U.S. Pat. No. 6,302,100 issued to Vandenberg, and entitled "System for collimating and concentrating direct and diffused radiation" is directed to a system and a method for collimating light energy falling randomly from a plurality of directions onto a fixed positioned thin flat surface. The system includes a collimator for collimating incident light, a lens for concentrating light collimated by the collimator, a light funnel for further concentrating light concentrated by the lens, and a receiver. The collimated light is concentrated by an assembly of converging and diverging prismatic slabs and optical means towards the light funnel. Each prism slab's longitudinal axis is parallel to the shortest side of the collector. Each diverging prism has a first side in contact with a converging prism, and a second side in contact with another converging prism. The index of refraction of the converging prisms differs from the index of refraction of the diverging prisms.

SUMMARY OF THE DISCLOSED TECHNIQUE

It is an object of the disclosed technique to provide a novel method and system for optically concentrating light rays using two Fresnel lenses.

In accordance with the disclosed technique, there is thus provided an apparatus for concentrating light rays arriving from at least one opening onto a receiver, wherein the individual beams of the light rays each arrive at the apparatus substantially collimated. The apparatus includes a respective Fresnel lens assembly for each opening. Each Fresnel lens assembly includes a first Fresnel lens and a second Fresnel lens. The first Fresnel lens is located between the opening and the receiver. The second Fresnel lens is located between the first Fresnel lens and the receiver. The first Fresnel lens collimates the light rays arriving from the opening, and the second Fresnel lens converges the collimated light rays onto the receiver. The opening is located in front of the Fresnel lens assembly, on the focal plane of the first Fresnel lens, centered on the focal point of the first Fresnel lens. The receiver is located behind the Fresnel lens assembly, on the focal point of the second Fresnel lens.

According to another aspect of the disclosed technique, there is thus provided an apparatus for concentrating light rays arriving from at least one opening onto a receiver, wherein the individual beams of the light rays each arrive at the apparatus substantially collimated. The apparatus includes a respective lens assembly for each opening. Each lens assembly includes a first lens and a second lens. The first lens is located between the opening and the receiver. The second lens is located between the first lens and the receiver. The first lens collimates the light rays arriving from the opening. The second lens converges the collimated light rays onto the receiver. The opening is located in front of the lens assembly, on the focal plane of the first lens, centered on the focal point of the first lens. The receiver is located behind the lens assembly, on the focal point of the second lens.

BRIEF DESCRIPTION OF THE DRAWINGS

The disclosed technique will be understood and appreciated more fully from the following detailed description taken in conjunction with the drawings in which.

DETAILED DESCRIPTION OF THE EMBODIMENTS

The disclosed technique overcomes the disadvantages of the prior art by providing an optical concentrator comprising two Fresnel lenses. One Fresnel lens is used to collimate incoming light rays, whereas the other Fresnel lens is used to concentrate the incoming light rays onto a small photodetector. The disclosed technique provides a product which is lightweight, compact, and cost effective.

Figure 1A:
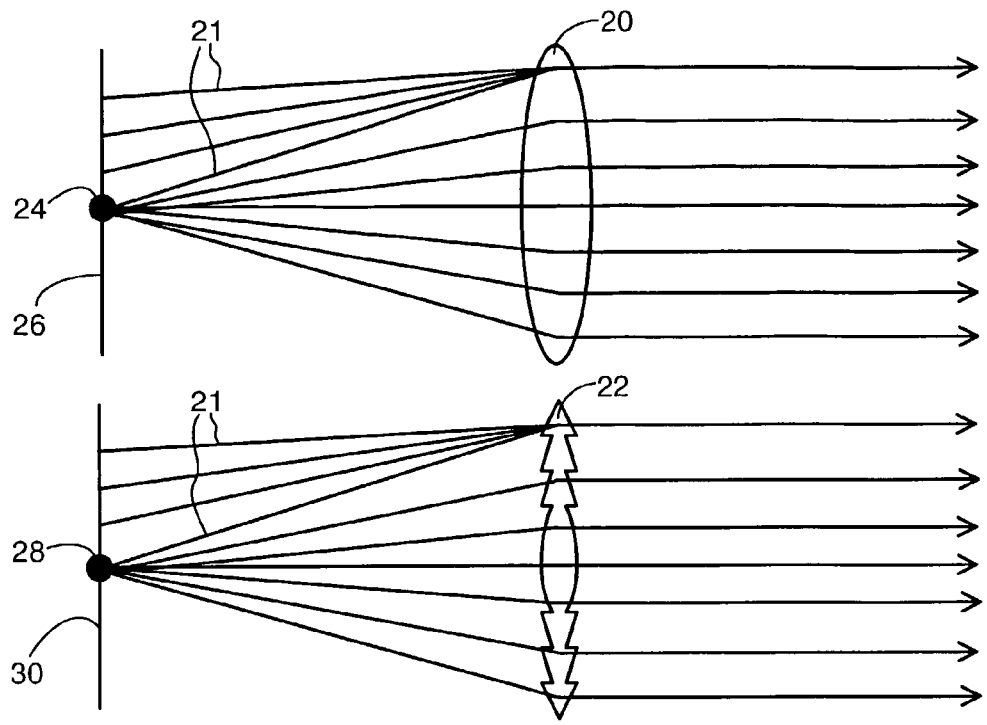
FIG. 1A is a schematic diagram of the prior art illustrating the collimating properties of convex lenses and Fresnel lenses.

Fresnel lenses produce the same optical effects of conventional lenses, be it concentrating light, collimating light, or dispersing light, for a fraction of the weight, volume and width of conventional lenses. This is due to their unique design. Reference is now made to FIG. 1A, which is a schematic diagram illustrating the collimating properties of a convex lens and a Fresnel lens. Convex lens 20 has a property whereby light rays 21 passing through its surface are collimated provided such light rays pass through point 24, an imaginary point known as the focal point. In fact, any light ray passing through line 26, an imaginary line known as the focal plane, will be collimated by convex lens 20. This property is due to the refractive nature of light rays passing through different media. The distance from focal plane 26 to convex lens 20 is known as the focal length and is specific for the particular curvature of convex lens 20. Fresnel lens 22, just like convex lens 20, has the same property whereby light rays 21 passing through its surface are collimated, provided such light rays pass through its focal point 28 or its focal plane 30.

Figure 1B:
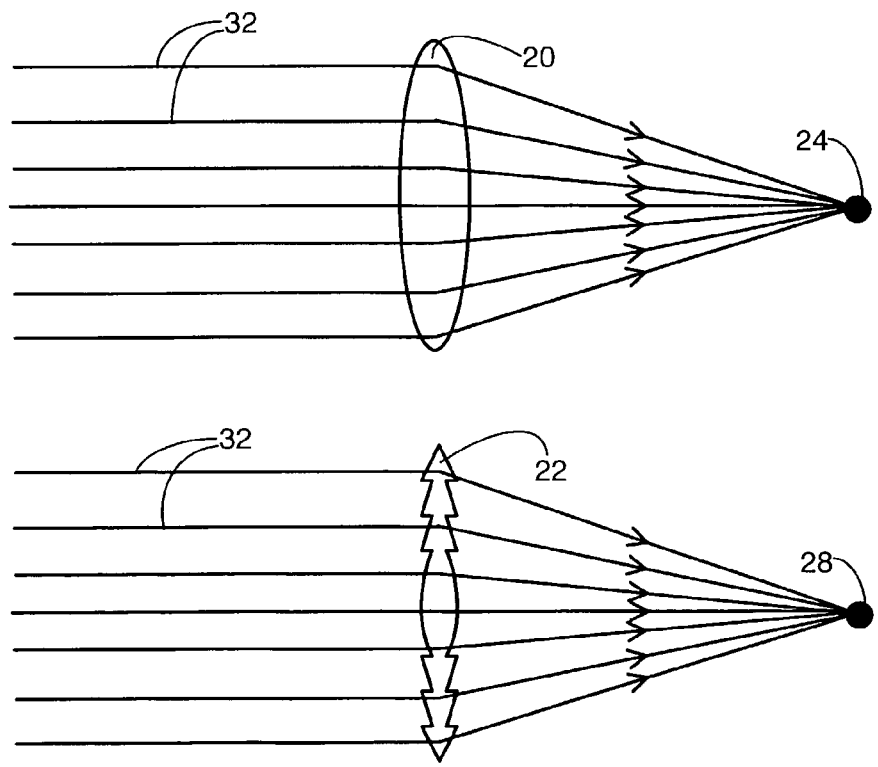
FIG. 1B is a schematic diagram illustrating the converging properties of convex and Fresnel lenses.

Reference is now made to FIG. 1B, which is a schematic diagram illustrating the converging properties of a convex lens and a Fresnel lens. Convex lens 20 has a property whereby collimated light 32 passing through its surface can be converged onto its focal point 24. This property is due to the refractive nature of light rays passing through different media. Fresnel lens 22, just like convex lens 20, has the same property whereby collimated light 32 passing through its surface is converged onto its focal point 28.

Figure 2:
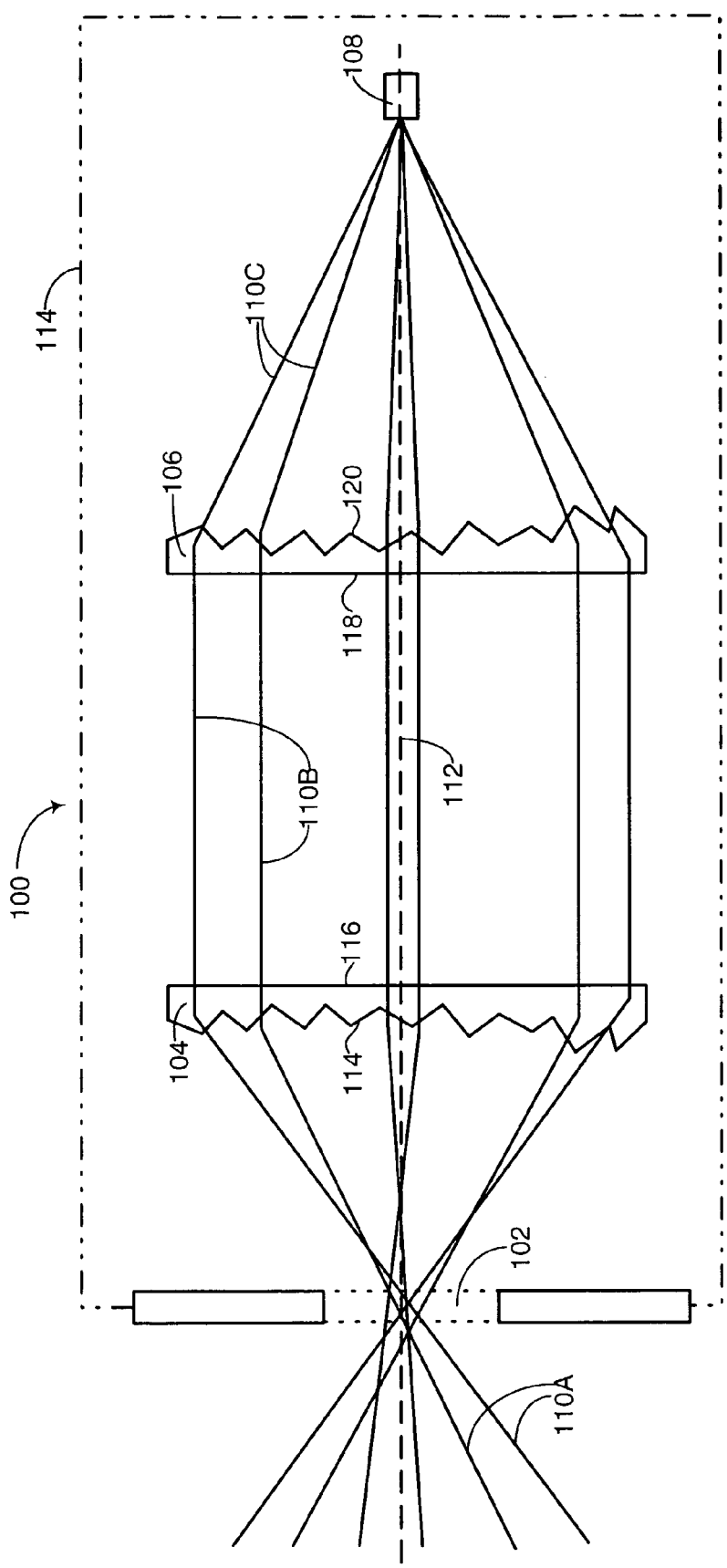
FIG. 2 is a schematic diagram of a system, constructed and operative in accordance with an embodiment of the disclosed technique.

Reference is now made to FIG. 2, which is a schematic diagram of a system, generally referenced 100, constructed and operative in accordance with an embodiment of the disclosed technique. System 100 includes opening 102, first Fresnel lens 104, second Fresnel lens 106, and photodetector 108. System 100 may be encapsulated in closed structure 114 to prevent ambient light or other external light sources from entering it. Opening 102 is located on the focal plane of first Fresnel lens 104, centered along optical axis 112 of first Fresnel lens 104 and second Fresnel lens 106. Opening 102 is located in front of first Fresnel lens 104. Optical axis 112 passes through the focal points of both Fresnel lenses. Opening 102 can vary in size. If opening 102 is larger than the diameter of Fresnel lenses 104 and 106, some of the light entering system 100, via opening 102, may not be concentrated on photodetector 108. Side 114 of first Fresnel lens 104 is ridged, whereas side 116 of first Fresnel lens 104 is flat. Fresnel lenses can be referred to as ridged lenses as their unique design gives them the appearance of having ridges. First Fresnel lens 104 has its ridged side 114 facing opening 102. First Fresnel lens 104 and second Fresnel lens 106 are substantially similar in size. Second Fresnel lens 106 is located behind first Fresnel lens 104, centered on optical axis 112 such that optical axis 112 passes through its focal point. Side 120 of second Fresnel lens 106 is ridged, whereas side 118 of second Fresnel lens 106 is flat. Second Fresnel lens 106 has its flat side 118 facing opening 102. In an embodiment of the disclosed technique, second Fresnel lens 106 and first Fresnel lens 104 are fit together by joining side 116 of first Fresnel lens 104 to side 118 of second Fresnel lens 106. In another embodiment of the disclosed technique, first Fresnel lens 104 and second Fresnel lens 106 are located a distance apart from one another. In a further embodiment of the disclosed technique, first Fresnel lens 104 can have its flat side 116 facing opening 102. In another embodiment of the disclosed technique second Fresnel lens 106 can have its ridged side 120 facing opening 102. Photodetector 108 is located on the focal plane of second Fresnel lens 106, centered on optical axis 112. Photodetector 108 is located behind second Fresnel lens 106. This means that photodetector 108 is located on the focal point of second Fresnel lens 106. Photodetector 108 is significantly smaller than the size of opening 102.

System 100 works in the following generalized manner. Light rays 110A arrive at system 100 from multiple directions. Incoming, light rays 110A, to be concentrated on photodetector 108, pass through opening 102. Since the size of opening 102 is, in general, much smaller than the distance between system 100 and the source of light rays 110A, each individual beam of light passing through opening 102 will pass there through as a substantially collimated beam of light. Opening 102 is the only way for incoming light rays to fall incident on Fresnel lenses 104 and 106 because system 100 may be completely encapsulated within closed structure 114. Since opening 102 is smaller than or equal to the diameter of Fresnel lenses 104 and 106, and since opening 102 lies on the focal plane of first Fresnel lens 104, any light rays passing through opening 102 and falling incident on first Fresnel lens 104 will become substantially collimated, or substantially parallel with one another, after passing through first Fresnel lens 104. Once incoming light rays 110A pass through first Fresnel lens 104, they emerges as substantially collimated light rays 110B due to the specific location of opening 102 vis-a-vis first Fresnel lens 104. Substantially collimated light rays 110B then fall incident on second Fresnel lens 106. Since the light rays falling incident on second Fresnel lens 106 are substantially collimated, they will pass through second Fresnel lens 106 and then converge onto the focal point of second Fresnel lens 106. Since photodetector 108 is located on the focal point of second Fresnel lens 106, convergent light rays 110C exiting second Fresnel lens 106 will be concentrated on photodetector 108.

In general, there is no restriction on the distance between first Fresnel lens 104 and second Fresnel lens 106, although due to the ridged nature of first Fresnel lens 104, some of substantially collimated light rays 110B may disperse slightly once they pass through first Fresnel lens 104. The amount of dispersion, in terms of distance from the ends of second Fresnel lens 106, depends on the distance between the two Fresnel lenses. As the distance between the two Fresnel lenses increases, the amount of dispersion, in terms of distance from the ends of second Fresnel lens 106, also increases. If the amount of dispersion is significant, then the diameter of second Fresnel lens 106 needs to be increased accordingly to converge the dispersed rays that pass through first Fresnel lens 104 onto photodetector 108.

It is noted that first Fresnel lens 104 and second Fresnel lens 106 can each be replaced by a cylindrical Fresnel lens. It is also noted that first Fresnel lens 104 and second Fresnel lens 106 can be replaced by a double-sided Fresnel lens. It is further noted that first Fresnel lens 104 and second Fresnel lens 106 can each be replaced by a spherical lens, a cylindrical lens, or a regular lens.

Figure 3:
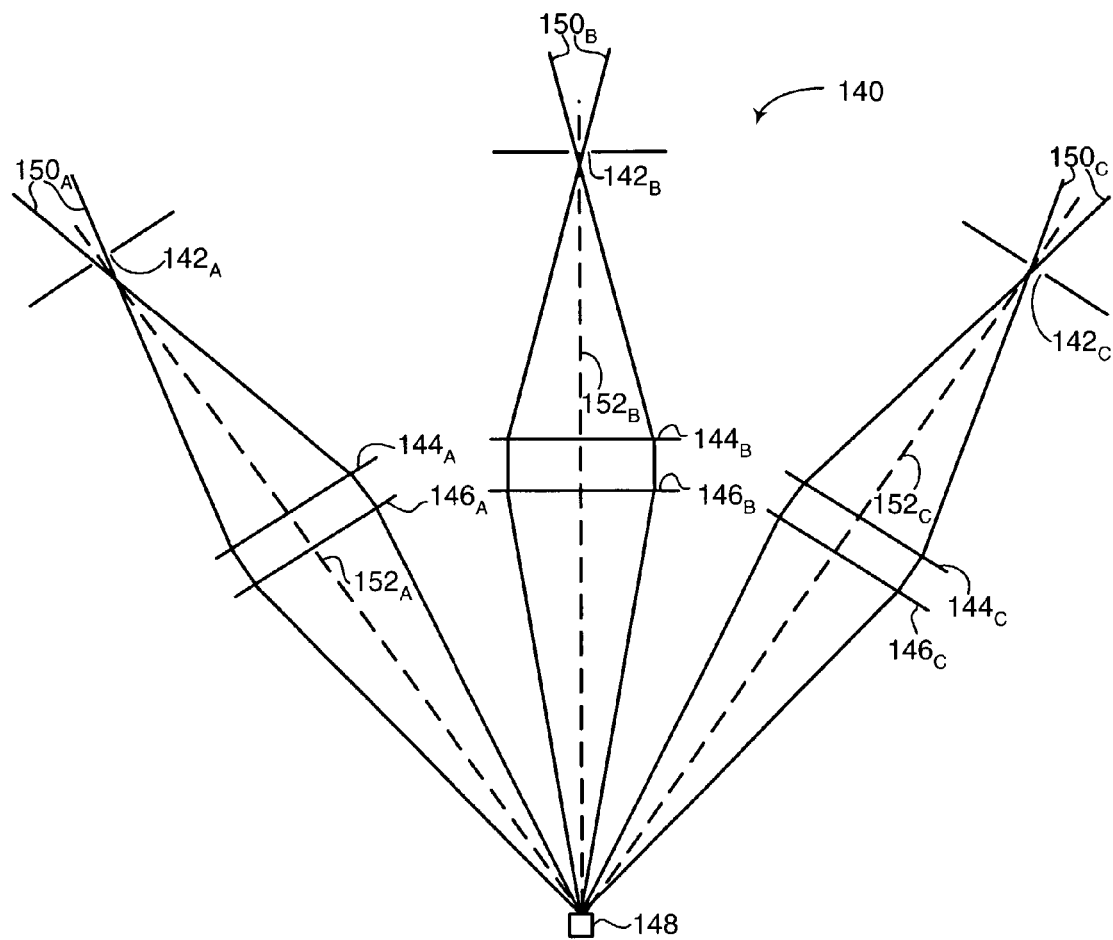
FIG. 3 is a schematic diagram of another system, constructed and operative in accordance with an embodiment of the disclosed technique.

Reference is now made to FIG. 3, which is a schematic diagram of another system, generally referenced 140, constructed and operative in accordance with an embodiment of the disclosed technique. System 140 includes three Fresnel lens sets which are each substantially similar to system 100 (FIG. 2). System 140 includes openings $142_A$, $142_B$ and $142_C$, first Fresnel lenses $144_A$, $144_B$ and $144_C$, second Fresnel lenses $146_A$, $146_B$ and $146_C$, and photodetector 148. One side of each of first Fresnel lenses $144_A$, $144_B$ and $144_C$ is ridged, whereas the other side of each of first Fresnel lenses $144_A$, $144_B$ and $144_C$ is flat. One side of each of second Fresnel lenses $146_A$, $146_B$ and $146_C$ is ridged, whereas the other side of each of second Fresnel lenses $146_A$, $146_B$ and $146_C$ is flat. First Fresnel lenses $144_A$, $144_B$ and $44_C$, and second Fresnel lenses $146_A$, $146_B$ and $146_C$, are substantially similar in size.

Opening $142_A$ is located on the focal plane of first Fresnel lens $144_A$, centered along optical axis $152_A$ of first Fresnel lens $144_A$ and second Fresnel lens $146_A$. Opening $142_A$ is located in front of first Fresnel lens $144_A$. Optical axis $152_A$ passes through the focal points of both Fresnel lenses. Second Fresnel lens $146_A$ is located behind first Fresnel lens $144_A$, centered on optical axis $152_A$ such that optical axis $152_A$ passes through its focal point. Opening $142_B$ is located on the focal plane of first Fresnel lens $144_B$, centered along optical axis $152_B$ of first Fresnel lens $144_B$ and second Fresnel lens $146_B$. Opening $142_B$ is located in front of first Fresnel lens $144_B$. Optical axis $152_B$ passes through the focal points of both Fresnel lenses. Second Fresnel lens $146_B$ is located behind first Fresnel lens $144_B$, centered on optical axis $152_B$ such that optical axis $152_B$ passes through its focal point. Opening $142_C$ is located on the focal plane of first Fresnel lens $144_C$, centered along optical axis $152_C$ of first Fresnel lens $144_C$ and second Fresnel lens $146_C$. Opening $142_C$ is located in front of first Fresnel lens $144_C$. Optical axis $152_C$ passes through the focal points of both Fresnel lenses. Second Fresnel lens $146_C$ is located behind first Fresnel lens $144_C$, centered on optical axis $152_C$ such that optical axis $152_C$ passes through its focal point.

Photodetector 148 is located on the intersection of the focal planes of second Fresnel lenses $146_A$, $146_B$ and $146_C$. Photodetector 148 is located behind second Fresnel lenses $146_A$, $146_B$ and $146_C$. This means that photodetector 148 is located on the focal points of second Fresnel lenses $146_A$, $146_B$ and $146_C$. Second Fresnel lenses $146_A$, $146_B$ and $146_C$ are configured such that their respective focal points all coincide. Photodetector 148 is significantly smaller than the size of openings $142_A$, $142_B$ and $142_C$. Openings $142_A$, $142_B$ and $142_C$ can vary in size. If the openings are larger than the diameter of the Fresnel lenses, some of the light entering system 140, via opening $142_A$, $142_B$ and $142_C$ may not be concentrated on photodetector 148. In an embodiment of the disclosed technique, second Fresnel lenses $146_A$, $146_B$ and $146_C$ are each respectively fit together to first Fresnel lenses $144_A$, $144_B$ and $144_C$ by respectively joining the flat side of each of first Fresnel lenses $144_A$, $144_B$ and $144_C$ to the respective flat side of each of second Fresnel lenses $146_A$, $146_B$ and $146_C$.

Each Fresnel lens set and opening (for example opening $142_A$, first Fresnel lens $144_A$ and second Fresnel lens $146_A$) is configured to receive light rays, for example light rays $150_A$, $150_B$ and $150_C$, coming from different directions. It is noted that each individual beam of light, in each of light rays $150_A$, $150_B$ and $150_C$, arrives at system 140 substantially collimated. Each individual beam of light arrives at system 140 substantially collimated since the size of openings $142_A$, $142_B$ and $142_C$ are, in general, much smaller than the distance between system 140 and the source of light rays $150_A$, $150_B$ and $150_C$. The location and orientation of each Fresnel lens set and opening, with respect to one another, is such that photodetector 148 is simultaneously located at the focal point of each second Fresnel lens of each Fresnel lens set. In another embodiment of the disclosed, a plurality of Fresnel lens sets and openings are configured to receive light rays coming from different directions. The location and orientation of each Fresnel lens set and opening, with respect to one another, is such that photodetector 148 is simultaneously located at the focal point of each second Fresnel lens of each Fresnel lens set. System 140 allows light rays coming from a plurality of directions to be concentrated onto a single photodetector.

It will be appreciated by persons skilled in the art that the disclosed technique is not limited to what has been particularly shown and described hereinabove. Rather the scope of the disclosed technique is defined only by the claims, which follow.

The invention claimed is:

1. Apparatus, for concentrating light rays arriving from at least one opening onto a receiver, said light rays originating from at least one source external to said apparatus, the distance between the at least one source of said light rays and said apparatus being substantially larger than the size of said opening, individual beams of said light rays thereby each arriving at said apparatus substantially collimated, comprising:

a respective Fresnel lens assembly for each said at least one opening, said at least one respective Fresnel lens assembly including:
a first Fresnel lens, located between a respective one of said at least one opening and said receiver, for making parallel with an optical axis of said first Fresnel lens, said light rays arriving from said respective one of said at least one opening; and
a second Fresnel lens, located between said first Fresnel lens and said receiver, for converging said parallel light rays onto said receiver,
wherein each said at least one opening is located in front of said respective Fresnel lens assembly, on the focal plane of said respective first Fresnel lens, centered on the focal point of said respective first Fresnel lens,
wherein said receiver is located behind each said at least one respective Fresnel lens assembly, on the focal point of the respective said second Fresnel lens,
wherein, for each said respective Fresnel lens assembly, the distance from said respective one of said at least one opening to said receiver is approximate to the accumulated distance of the focal length of said respective first Fresnel lens, the focal length of said respective second Fresnel lens and the space between said respective first Fresnel lens and said respective second Fresnel lens,
wherein said space is substantially zero.

2. The apparatus according to claim 1, wherein said respective first Fresnel lens and said respective second Fresnel lens each include a ridged side and a flat side,
wherein said respective first Fresnel lens has its ridged side facing said respective one of said at least one opening and its flat side facing said respective second Fresnel lens, and wherein said respective second Fresnel lens has its flat side facing said respective first Fresnel lens and its ridged side facing said receiver.

3. The apparatus according to claim 2, wherein said respective Fresnel lenses are substantially similar in size.

4. The apparatus according to claim 2, wherein said respective Fresnel lenses are joined together into a single optical element.

5. The apparatus according to claim 1, wherein, for each said respective Fresnel lens assembly, said respective one of said at least one opening is substantially equal in size, or smaller in size, than a diameter of said respective first Fresnel lens and said respective second Fresnel lens.

6. The apparatus according to claim 1, further comprising a closed structure for preventing ambient light from entering said apparatus, wherein said at least one opening is located on said closed structure, and said closed structure encapsulates said respective Fresnel lens assembly and said receiver.

7. The apparatus according to claim 1, wherein at least one of said first Fresnel lens and said second Fresnel lens, is selected from the group consisting of:
Fresnel lens;
cylindrical Fresnel lens; and
double-sided Fresnel lens.

8. Apparatus, for concentrating light rays arriving from at least one opening onto a receiver, said light rays originating from at least one source external to said apparatus, the distance between the at least one source of said light rays and said apparatus being substantially larger than the size of said opening, individual beams of said light rays thereby each arriving at said apparatus substantially collimated, the apparatus comprising:
a respective lens assembly for each said at least one opening, said at least one respective lens assembly including:
a first lens, located between a respective one of said at least one opening and said receiver, for making parallel with an optical axis of said first lens said light rays arriving from said respective one of said at least one opening; and
a second lens, located between said first lens and said receiver, for converging said parallel light rays onto said receiver,
wherein each said at least one opening is located in front of said respective lens assembly, on the focal plane of said respective first lens, centered on the focal point of said respective first lens,
wherein said receiver is located behind each said at least one respective lens assembly, on the focal point of the respective said second lens,
wherein, for each said respective lens assembly, the distance from said respective one of said at least one opening to said receiver is approximate to the accumulated distance of the focal length of said respective first lens, the focal length of said respective second lens and the space between said respective first lens and said respective second lens, and
wherein said space is substantially zero.

9. The apparatus according to claim 8, wherein said respective first lens and said respective second lens each include a ridged side and a flat side,
wherein said respective first lens has its ridged side facing said respective one of said at least one opening and its flat side facing said respective second lens, and wherein said respective second lens has its flat side facing said respective first lens and its ridged side facing said receiver.

10. The apparatus according to claim 9, wherein said respective lenses are substantially similar in size.

11. The apparatus according to claim 9, wherein said respective lenses are joined together into a single optical element.

12. The apparatus according to claim 8, wherein, for each said respective lens assembly, said respective one of said at least one opening is substantially equal in size, or smaller in size, than a diameter of said respective first lens and said respective second lens.

13. The apparatus according to claim 8, further comprising a closed structure for preventing ambient light from entering said apparatus, wherein said at least one opening is located on said closed structure, and said closed structure encapsulates said respective lens assembly and said receiver.

14. The apparatus according to claim 8, wherein at least one of said first lens and said second lens is selected from the group consisting of:
cylindrical lenses; and
regular lenses.

15. Apparatus, for concentrating light rays arriving from at least one opening onto a receiver, said light rays originating from at least one source external to said apparatus, the distance between the at least one source of said light rays and said apparatus being substantially larger than the size of said opening, individual beams of said light rays thereby each arriving at said apparatus substantially collimated, comprising:
a respective Fresnel lens assembly for each said at least one opening, said at least one respective Fresnel lens assembly including:
a first Fresnel lens, located between a respective one of said at least one opening and said receiver, for making parallel with an optical axis of said first Fresnel lens, said light rays arriving from said respective one of said at least one opening; and
a second Fresnel lens, located between said first Fresnel lens and said receiver, for converging said parallel light rays onto said receiver,
wherein each said at least one opening is located in front of said respective Fresnel lens assembly, on the focal plane of said respective first Fresnel lens, centered on the focal point of said respective first Fresnel lens,
wherein said receiver is located behind each said at least one respective Fresnel lens assembly, on the focal point of the respective said second Fresnel lens,
wherein, for each said respective Fresnel lens assembly, the distance from said respective one of said at least one opening to said receiver is approximate to the accumulated distance of the focal length of said respective first Fresnel lens, the focal length of said respective second Fresnel lens and the space between said respective first Fresnel lens and said respective second Fresnel lens,
wherein said respective first Fresnel lens and said respective second Fresnel lens each include a ridged side and a flat side,
wherein said respective first Fresnel lens has its ridged side facing said respective one of said at least one opening and its flat side facing said respective second Fresnel lens, and wherein said respective second Fresnel lens has its flat side facing said respective first Fresnel lens and its ridged side facing said receiver, wherein said respective Fresnel lenses are joined together into a single optical element.

16. Apparatus, for concentrating light rays arriving from at least one opening onto a receiver, said light rays originating from at least one source external to said apparatus, the distance between the at least one source of said light rays and said apparatus being substantially larger than the size of said opening, individual beams of said light rays thereby each arriving at said apparatus substantially collimated, the apparatus comprising:

a respective lens assembly for each said at least one opening, said at least one respective lens assembly including:

a first lens, located between a respective one of said at least one opening and said receiver, for making parallel with an optical axis of said first lens said light rays arriving from said respective one of said at least one opening; and a second lens, located between said first lens and said receiver, for converging said parallel light rays onto said receiver, wherein each said at least one opening is located in front of said respective lens assembly, on the focal plane of said respective first lens, centered on the focal point of said respective first lens, wherein said receiver is located behind each said at least one respective lens assembly, on the focal point of the respective said second lens, wherein, for each said respective lens assembly, the distance from said respective one of said at least one opening to said receiver is approximate to the accumulated distance of the focal length of said respective first lens, the focal length of said respective second lens and the space between said respective first lens and said respective second lens, wherein said respective first lens and said respective second lens each include a ridged side and a flat side, wherein said respective first lens has its ridged side facing said respective one of said at least one opening and its flat side facing said respective second lens, and wherein said respective second lens has its flat side facing said respective first lens and its ridged side facing said receiver, wherein said respective lenses are joined together into a single optical element.

* * * * *